(12) United States Patent
Kim et al.

(10) Patent No.: US 12,456,973 B2
(45) Date of Patent: Oct. 28, 2025

(54) POWER CONVERTER

(71) Applicant: KOREA ELECTRONICS TECHNOLOGY INSTITUTE, Seongnam-si (KR)

(72) Inventors: Jin Hong Kim, Suwon-si (KR); Joon Sung Park, Seoul (KR); Byong Jo Hyon, Anyang-si (KR); Yongsu Noh, Seoul (KR); Dongmyoung Joo, Bucheon-si (KR); Sang Min Park, Bucheon-si (KR); Daeyeon Hwang, Incheon (KR); Hyoung-Kyu Yang, Seoul (KR); Jun Hyuk Choi, Bucheon-si (KR)

(73) Assignee: KOREA ELECTRONICS TECHNOLOGY INSTITUTE, Seongnam-si (KR)

( * ) Notice: Subject to any disclaimer, the term of this patent is extended or adjusted under 35 U.S.C. 154(b) by 70 days.

(21) Appl. No.: 18/513,413

(22) Filed: Nov. 17, 2023

(65) Prior Publication Data

US 2024/0204770 A1 Jun. 20, 2024

(30) Foreign Application Priority Data

Nov. 22, 2022 (KR) .......... 10-2022-0157209

(51) Int. Cl.
*H03K 17/16* (2006.01)
*H02M 3/156* (2006.01)

(52) U.S. Cl.
CPC .......... *H03K 17/161* (2013.01); *H02M 3/156* (2013.01); *H03K 2217/0027* (2013.01); *H03K 2217/0081* (2013.01)

(58) Field of Classification Search
None
See application file for complete search history.

(56) References Cited

U.S. PATENT DOCUMENTS

| | | | | |
|---|---|---|---|---|
| 7,948,276 B2* | 5/2011 | Nilson | ................. | H03K 17/165 326/82 |
| 11,057,029 B2* | 7/2021 | Westwick | ............ | H03K 17/168 |
| 11,394,372 B2* | 7/2022 | Joo | ....................... | H03K 17/163 |

FOREIGN PATENT DOCUMENTS

| | | |
|---|---|---|
| JP | H09270691 A | 10/1997 |
| JP | 2015023774 A | 2/2015 |
| JP | 2016158478 A | 9/2016 |
| JP | 2023168735 A | 11/2023 |
| KR | 20150049994 A | 5/2015 |
| KR | 20210059621 A | 5/2021 |

* cited by examiner

*Primary Examiner* — Jeffrey S Zweizig
(74) *Attorney, Agent, or Firm* — McCoy Russell LLP

(57) ABSTRACT

The present disclosure relates to a power converter capable of improving stabilization while minimizing loss when switching a switch included in the power converter. The power converter includes a switch; a gate driver configured to drive the switch at a predetermined duty ratio and apply a positive voltage when the switch is turned on and a negative voltage when the switch is turned off; a negative power supply unit configured to supply the negative voltage to the gate driver and vary a magnitude of the negative voltage; a current sensor configured to sense a current flowing in the switch; and a control unit configured to control the negative power supply unit to adjust the magnitude of the negative voltage applied to the switch according to a value sensed by the current sensor.

6 Claims, 6 Drawing Sheets

POWER CONVERTER

CROSS-REFERENCE TO RELATED APPLICATION

This application claims priority under 35 U.S.C. § 119 to Korean Patent Application No. 10-2022-0157209, filed on Nov. 22, 2022, in the Korean Intellectual Property Office, the disclosure of which is incorporated herein by reference in its entirety.

TECHNICAL FIELD

The following disclosure relates to a power converter, and more particularly, to a power converter capable of achieving stabilization and high efficiency of a driving unit in a WBG-based power converter.

BACKGROUND

WBG-based power semiconductors that are being developed recently have the characteristics in which a current and voltage increases per unit time during switching due to low parasitic capacitance characteristics. This acts as a factor that increases negative effects caused by parasitic impedance that inevitably occurs within a circuit when driving a gate. In particular, in a power converter to which a half-bridge structure is applied, among the upper and lower switches, there was a possibility that a switch malfunction could occur as the threshold voltage was exceeded in the switch that should be maintained in the blocking section during switching.

Conventionally, in order to solve this problem, a method was applied to prevent noise voltage generated when switching other switches from exceeding the threshold voltage by applying a negative voltage of a certain magnitude in a cutoff section. FIG. 1 is a circuit diagram of a conventional gate drive for a GaN device, and FIG. 2 is a graph of a gate-source voltage of a conventional gate drive for a GaN device, which illustrates a conventional method.

The method illustrated in FIGS. 1 and 2 may achieve the stabilization of the operation of the switch as the magnitude of the negative power of the driving unit increases, but has the disadvantage of increasing conduction loss due to the increase in a magnitude of an anti-parallel bias voltage.

SUMMARY

An embodiment of the present disclosure is directed to providing a power converter capable of improving stabilization while minimizing loss when switching a switch included in the power converter.

In one general aspect, a power converter includes: a switch; a gate driver configured to drive the switch at a predetermined duty ratio and apply a positive voltage when the switch is turned on and a negative voltage when the switch is turned off; a negative power supply unit configured to supply the negative voltage to the gate driver and vary a magnitude of the negative voltage; a current sensor configured to sense a current flowing in the switch; and a control unit configured to control the negative power supply unit to adjust the magnitude of the negative voltage applied to the switch according to a value sensed by the current sensor.

When the switch is turned on, the control unit may control the negative power supply unit so that the negative voltage becomes a first voltage if the switch is switched to be turned off when the current sensed by the current sensor is in a reverse direction or is less than or equal to a reference value.

When the switch is turned on, the control unit may control the negative power supply unit so that the negative voltage becomes a second voltage smaller than the first voltage if the switch is switched to be turned off when the current sensed by the current sensor exceeds the reference value.

The control unit may control the negative power supply unit based on a current value sensed by the current sensor so that when a current value in a predetermined section is less than or equal to the reference value before the switch is switched from turn on to turn off, the negative voltage becomes the first voltage when the switch is switched to be turned off.

The control unit may control the negative power supply unit based on the current value sensed by the current sensor so that when the current value in the predetermined section exceeds the reference value before the switch is switched from turn on to turn off, the negative voltage becomes a second voltage smaller than the first voltage when the switch is switched to be turned off.

The switch may be a wide band-gap (WBG) power semiconductor device.

DETAILED DESCRIPTION OF MAIN ELEMENTS

Figure 1:
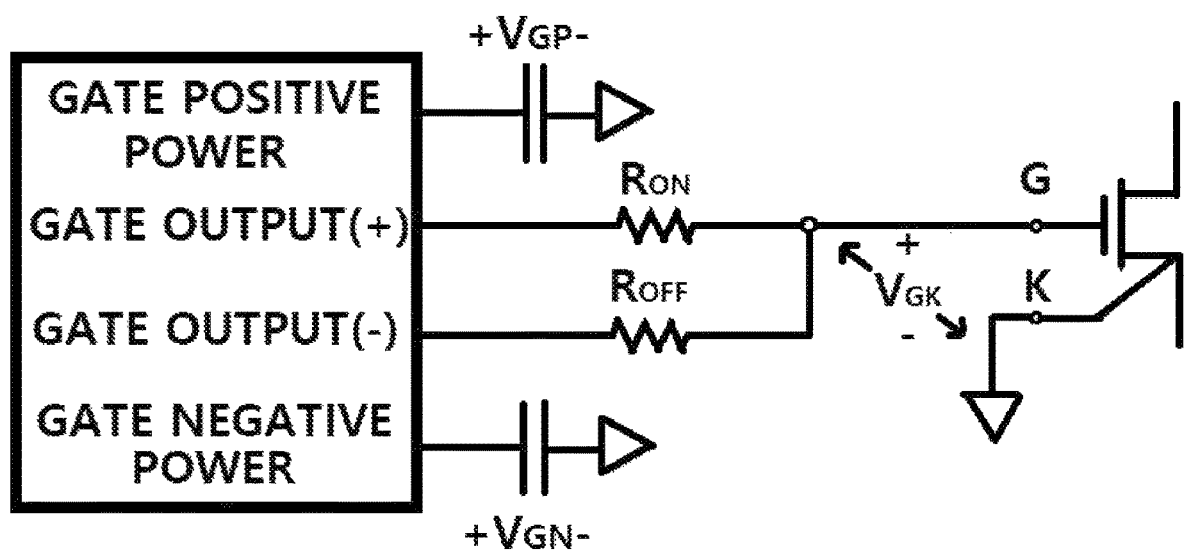
FIG. 1 is a configuration diagram of a conventional gate drive for a GaN device.
Figure 2:
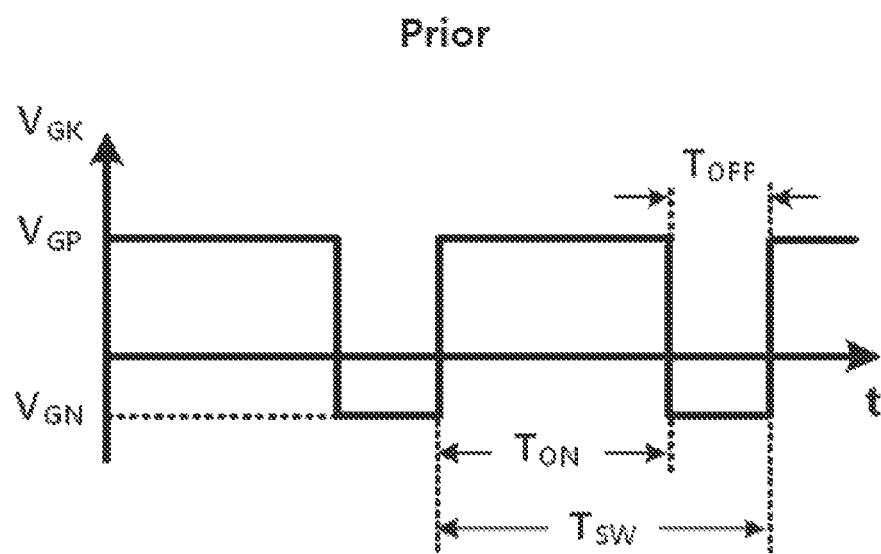
FIG. 2 is a graph of a gate-source voltage of the conventional gate drive for a GaN device.

100: Switch
200: Gate driver
310: Negative power supply unit
320: Positive power supply unit
400: Control unit

DETAILED DESCRIPTION OF EMBODIMENTS

The above-described objects, features, and advantages of the present disclosure will become more obvious from the following detailed description provided in relation to the accompanying drawings. The following specific structural or functional descriptions are only exemplified for the purpose of explaining the embodiments according to the concept of the present disclosure, and the embodiments according to the concept of the present disclosure may be implemented in various forms and should not be construed as limited to the embodiments described herein or in the application. Since embodiments according to the concept of the present disclosure may be variously modified and may have several forms, specific embodiments will be illustrated in the accompanying drawings and will be described in detail in the present specification or application. However, it is to be understood that the present disclosure is not limited to specific embodiments, but includes all modifications, equivalents, and substitutions falling in the spirit and the scope of the present disclosure. Terms such as 'first', 'second', or the like, may be used to describe various components, but these components are not to be construed as being limited to these terms. The terms are used only to distinguish one component from another component. For example, a first component may be named a second component and the second component may also be named the first component, without departing from the scope of the present disclosure. It is to be understood that when one component is referred to as being connected to or coupled to another component, it may be connected directly to or coupled directly to another component or be connected to or coupled to another component with the other component interposed therebetween. On the other hand, it is to be understood that when one component is referred to as being connected directly to or coupled directly to another component, it may be connected to or coupled to another component without the other component interposed therebetween. Other expressions for describing the relationship between components, such as between and immediately between or adjacent to and directly adjacent to, etc., should be interpreted similarly. Terms used in the present specification are used only in order to describe specific embodiments rather than limiting the present disclosure. Singular forms are intended to include plural forms unless the context clearly indicates otherwise. It is to be understood that terms i°include, i±i°have, i±or the like, used in the present specification specify the presence of features, numerals, steps, operations, components, parts, or a combination thereof described in the present specification, but do not preclude the presence or addition of one or more other features, numerals, steps, operations, components, parts, or a combination thereof. Unless indicated otherwise, it is to be understood that all the terms used in the specification including technical and scientific terms have the same meaning as those that are generally understood by those who skilled in the art. Terms generally used and defined in a dictionary are to be interpreted as the same meanings with meanings within the context of the related art, and are not to be interpreted as ideal or excessively formal meanings unless clearly indicated in the present specification. Hereinafter, exemplary embodiments of the present disclosure will be described in detail with reference to the accompanying drawings. Like reference numerals proposed in each drawing denote like components.

First Embodiment

A power converter according to the present disclosure may include a general half-bridge or full-bridge type switch. The present disclosure relates to a method of controlling a switch included in a power converter. The power converter according to the present disclosure may include the switches having the half-bridge or full-bridge type structure, but the detailed circuit of the power converter will not be described in the specification of the present disclosure below.

Figure 3:
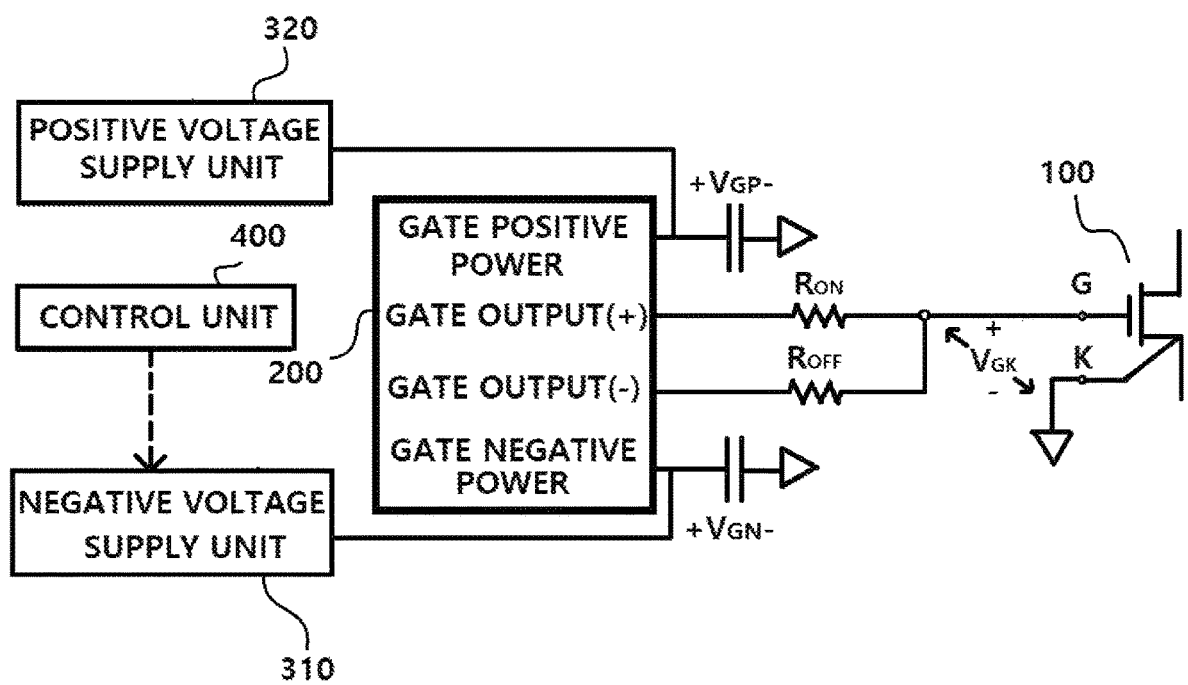
FIG. 3 is a circuit diagram of a gate driver and a switch of a power converter according to a first embodiment of the present disclosure.

FIG. 3 is a circuit diagram of a gate driver and a switch of the power converter according to a first embodiment of the present disclosure.

As illustrated in FIG. 3, the power converter according to the first embodiment of the present disclosure includes a switch 100, a gate driver 200, a negative power supply unit 310, a current sensor (not illustrated), and a control unit 400.

As described above, the switch 100 is included in the power converter according to the present disclosure and is used to convert and output power. In the power converter according to the first embodiment of the present disclosure, the switch 100 may be a wide band-gap (WBG) power semiconductor device. A material of the WBG power semiconductor may be silicon carbide (SiC) or gallium nitride (GaN), and in the present embodiment, the switch 100 may be a GaN-high electron mobility transistor (GaN-HEMT).

The gate driver 200 drives the switch 100 at a predetermined duty ratio, and applies a positive voltage to the switch 100 when the switch 100 is turned on, and applies a negative voltage when the switch 100 is turned off. More specifically, the switch 100 is turned on in a predetermined section in one cycle and turned off in the remaining section according to the duty ratio set in the gate driver 200, and the turned on/off operation, that is, the switching of the switch 100 is repeated.

The gate driver 200 may receive power from the outside to apply a positive or negative voltage to the switch 100. Referring to FIG. 3, the gate driver 200 may include a gate positive power port for receiving a positive voltage from the outside, a gate negative power port for receiving a negative voltage from the outside, a gate output port (+) for applying the positive voltage to the switch 100, and a gate output port (−) for applying the negative voltage to the switch 100.

The negative power supply unit 310 is configured to apply the negative voltage to the gate negative power port of the gate driver 200, and vary a magnitude of the negative voltage applied to the gate driver 200. That is, the negative power supply unit 310 may be a type of programmable power supply (PPS). The negative voltage applied from the negative power supply unit 310 to the gate driver 200 may be a direct current. The gate negative power port of the gate driver 200 may be grounded, and a capacitor may be provided between the ground and the port, and the negative power supply unit 310 may be connected between a capacitor and the port.

Similar to the negative power supply unit 310, the power converter according to the first embodiment of the present disclosure may further include a positive power supply unit 320 that applies the positive voltage to the gate driver 200.

The positive power supply unit 320 is connected to the gate positive power port of the gate driver 200 to apply the positive voltage. Similar to the negative power supply unit 310 described above, the positive voltage applied from the positive power supply unit 320 to the gate driver 200 may be a direct current. The positive voltage applied by the positive power supply unit 320 to the gate driver 200 may have a fixed value without separate control.

In the circuit diagram of the power converter according to the first embodiment of the present disclosure illustrated in FIG. 3, the positive power supply unit 320 and the negative power supply unit 310 described above are separated, but there may be an embodiment in which the positive power supply unit 320 and the negative power supply unit 310 are integrated with each other. In addition, although not illustrated in the drawing, the power converter according to the present disclosure may further include an operating power supply unit that supplies power for the operation of the gate driver 200. There may be an embodiment in which the operating power supply unit may also be installed separately from the positive power supply unit 320 and the negative power supply unit 310, or may be integrated with at least one of the positive power supply unit 320 and the negative power supply unit 310.

The current sensor senses a current flowing in the switch 100. More specifically, the current sensor senses the magnitude and direction of the current flowing from a source terminal to a drain terminal of the switch 100. To this end, a current sensor may be installed in at least one of the source terminal and the drain terminal of the switch 100. The value sensed by the current sensor may be transmitted to the control unit 400, which will be described later. To this end, the current sensor may be connected to the control unit 400 to enable mutual transmission and reception of signals. In this case, the connection method between the current sensor and the control unit 400 may be wired, but in some cases, may be connected wirelessly.

Referring to FIG. 3, a part extending downward of the switch 100 is the source terminal, and a part extending upward is the drain terminal. Regarding a direction of the current flowing in the switch 100, a source terminal→drain terminal direction is a forward direction, and a drain terminal→source terminal direction is a reverse direction.

The control unit 400 controls the negative power supply unit 310 according to the value sensed by the current sensor to adjust the magnitude of the negative voltage applied to the switch 100.

Figure 4:
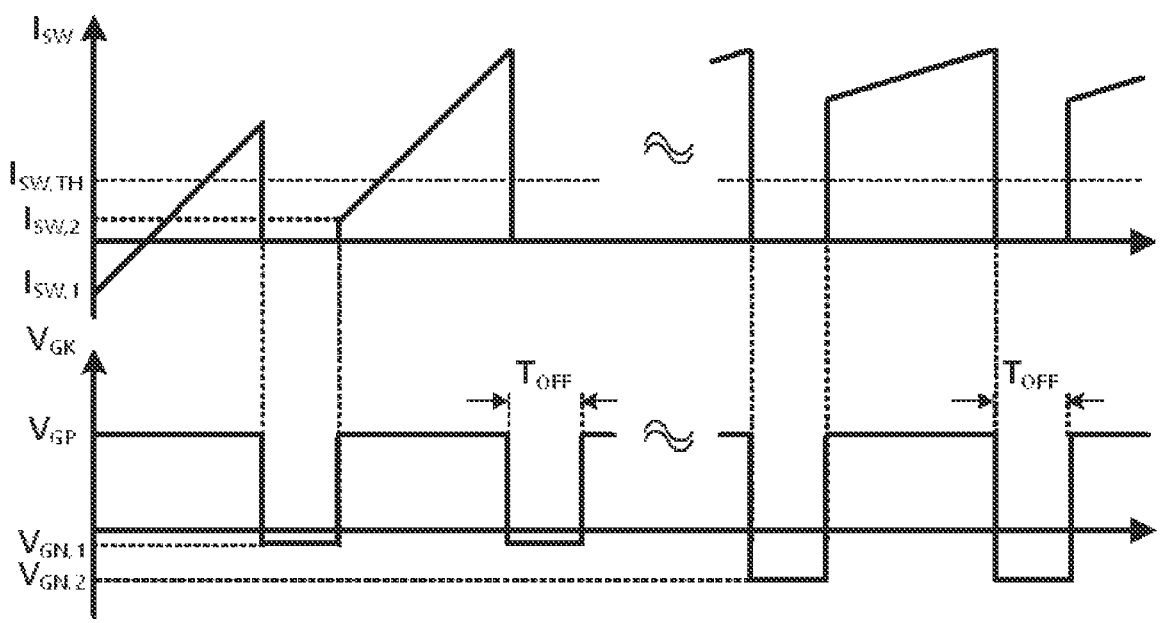
FIG. 4 is a graph of a voltage applied to the switch according to a current flowing in the switch of the power converter according to the first embodiment of the present disclosure.
Figure 5:
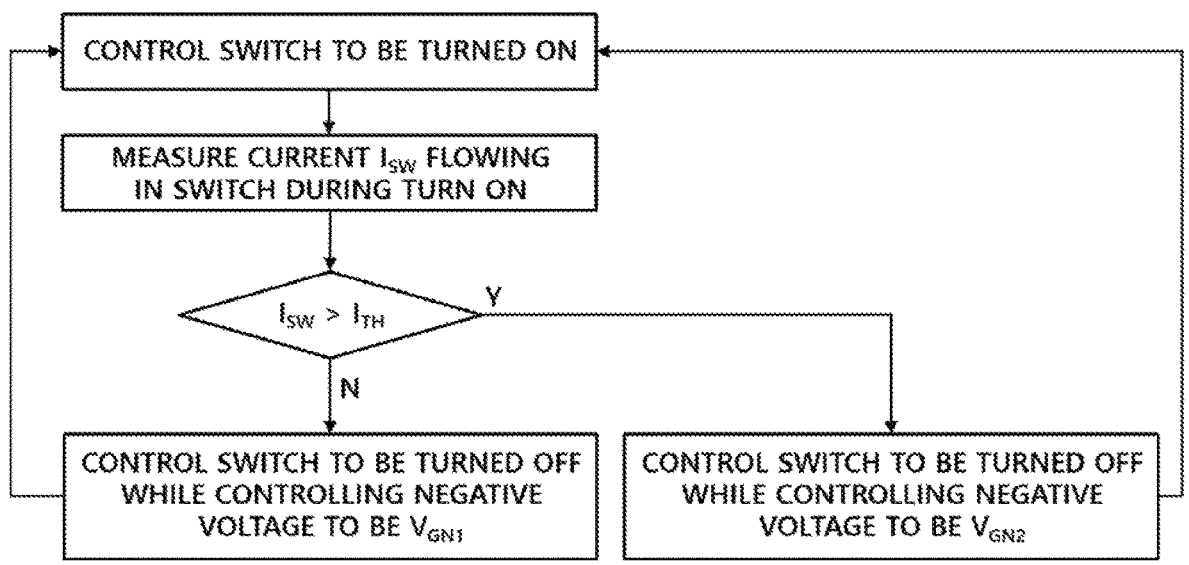
FIG. 5 is a flowchart of a process of determining a negative voltage applied to a gate driver in a control unit of the power converter according to the first embodiment of the present disclosure.

FIG. 4 is a graph of a voltage applied to the switch according to a current flowing in the switch of the power converter according to the first embodiment of the present disclosure, and FIG. 5 is a flowchart of a process of determining a negative voltage applied to a gate driver in a control unit of the power converter according to the first embodiment of the present disclosure.

With reference to FIGS. 4 and 5, the above-described operation of the control unit 400 of the power converter according to the first embodiment of the present disclosure will be described in more detail.

As previously described in the background art, when the switch 100 is switched from turn on to turn off according to a duty ratio in one cycle, since the amount of change (di/dt, dv/dt) in current and voltage per unit time are large due to the characteristics of low parasitic capacitance, when the switch 100 is turned off to stabilize the operation, the WBG-based power semiconductor applies a certain magnitude of negative voltage to prevent the switch to be turned off from being turned on. However, in this case, there is a disadvantage that a magnitude of an anti-parallel bias voltage increases and conduction loss increases. The power converter according to the first embodiment of the present disclosure changes the magnitude of the negative voltage applied when the switch 100 is turned off based on the magnitude and direction of the current flowing in the switch 100 sensed by the current sensor when the switch 100 is turned on. More specifically, when a current $I_{SW}$ flowing in the switch 100 when the switch 100 is turned on is less than or equal to a reference value $I_{SW,TH}$ or flows in a reverse direction, when the switch 100 is switched from turn on to turn off, the amount of change in current and voltage flowing in the switch 100 is relatively small. Referring to the left graph of FIG. 4, when the switch 100 is first turned on, the current flowing in the switch 100 is $I_{SW,1}$ and flows in the reverse direction. Therefore, in this case, the control unit 400 of the present embodiment applies a voltage command to the negative power supply unit 310 to control the magnitude of the negative voltage applied from the negative power supply unit 310 to the gate driver 200 to be a first voltage $V_{GN,1}$, thereby applying the first voltage $V_{GN,1}$ from the gate driver 200 to the switch 100. This is because, when the switch 100 is turned on, the magnitude of the current flowing in the switch 100 is relatively small, and therefore, when the switch 100 is turned off, the possibility that the switch 100 is conducted is relatively low. According to the present embodiment, by the method, when the switch 100 is switched from turned on to turned off, the conduction loss is reduced.

In addition, as illustrated in FIG. 4, when the switch 100 is turned on for the second time, the current flowing in the switch 100 is $I_{SW,2}$ and is less than or equal to the reference value $I_{SW,TH}$. In this case as well, the control unit 400 applies the voltage command to the negative power supply unit 310 so that the first voltage $V_{GN,1}$ is applied from the negative power supply unit 310 to the gate driver 200, and accordingly, when the switch 100 is turned off, the gate driver 200 applies the first voltage $V_{GN,1}$.

On the contrary, when the switch 100 is turned on, the current $I_{SW}$ flowing in the switch 100 sensed by the current sensor may exceed the reference value $I_{SW,TH}$, as illustrated in the right graph of FIG. 4. In this case, when the switch 100 is switched from turn on to turn off, the amount of change in current and voltage flowing in the switch 100 is relatively large. In this case, the control unit 400 may apply the voltage command to the negative power supply unit 310 to set the negative power applied from the negative power supply unit 310 to the gate driver 200 as a second voltage $V_{GN,2}$. In this case, the second voltage $V_{GN,2}$ is smaller than the first voltage $V_{GN,1}$. In this case, since the first voltage and the second voltage are the negative voltages, when compared in magnitude, the magnitude of the second voltage may be larger than that the first voltage. In the case described above, the present embodiment prevents the switch 100 from malfunctioning such as the switch being turned on in a section in which the switch 100 should be turned off, as in the related art.

Second Embodiment

Figure 6:
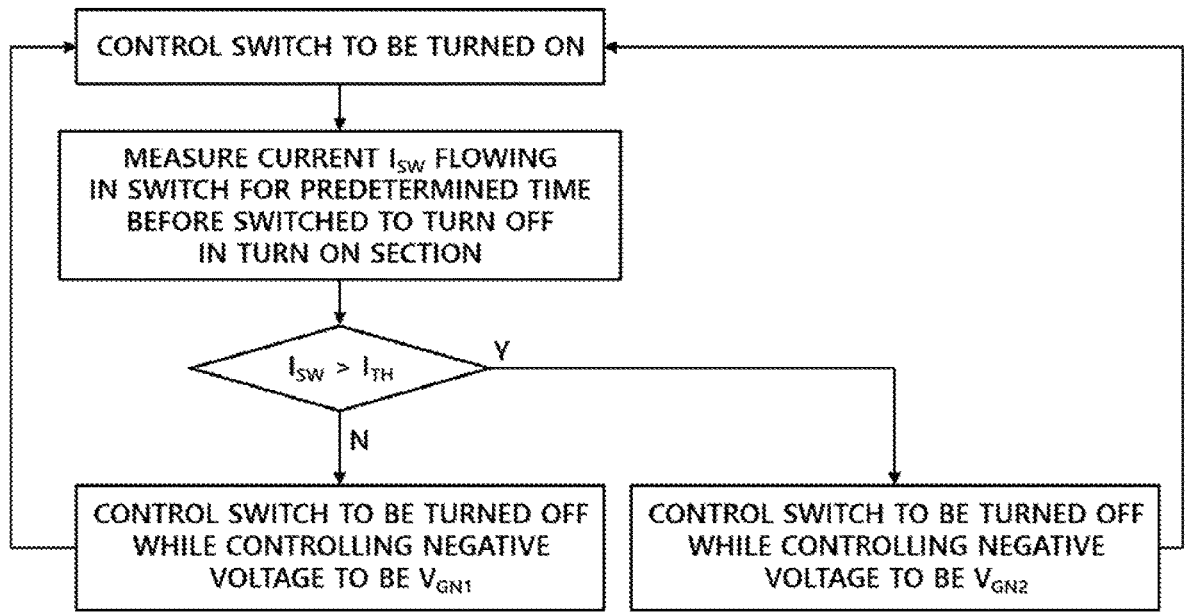
FIG. 6 is a flowchart of a process of determining a negative voltage applied to a gate driver in a control unit of a power converter according to a second embodiment of the present disclosure.

FIG. 6 is a flowchart of a process of determining a negative voltage applied to a gate driver in a control unit of a power converter according to a second embodiment of the present disclosure.

As illustrated in FIG. 6, the control unit 400 controls the negative power supply unit based on the current value sensed by the current sensor so that when a current value in a predetermined section is less than or equal to the reference value before the switch 100 is switched from turn on to turn off, the negative voltage applied fro the gate driver 200 to the switch 100 becomes the first voltage $V_{GN,1}$ when the switch is switched to be turned off, and controls the negative power supply unit based on the current value sensed by the current sensor so that when the current value in the predetermined section exceeds the reference value before the switch 100 is switched from turn on to turn off, the negative voltage becomes the second voltage $V_{GN,2}$ smaller than the first voltage $V_{GN,1}$ when the switch 100 is switched to be turned off.

The reason for the above-described operation in the present embodiment is that the value of the current flowing in the switch 100 immediately after the switch 100, which is the reference for determining the varying negative voltage in the first embodiment, is switched to be turned on, is not the value of the current when the switch 100 is switched from turn on to turn off, and therefore, may be relatively inaccurate. More specifically, the amount of increase in the current flowing in the switch 100 in the turn on section of one cycle of the switch 100 may vary depending on a topology of the power converter. Therefore, since the magnitude of the current flowing in the switch 100 may vary depending on the case when the switch 100 is switched from turn on to turn off, when the switch 100 described in the background art is switched from turn on to turn off, the amount of change in the current flowing in the switch and the amount of change in the voltage applied to a gate terminal of the switch become greater than the reference value, so a problem may occur in that the switch 100 conducts in the turn off section of the switch 100. Therefore, in the present embodiment, the comparison target for changing the magnitude of the negative voltage applied from the gate driver 200 to the switch 100 is changed to the value of the current in the predetermined section before the switch 100 is switched from turn on to turn off. As a result, by considering the extend to which the magnitude of the current flowing in the switch 100 increases in the section when the switch 100 is turned on, it is possible to reduce the magnitude of conduction loss while preventing the switch 100 from malfunctioning.

In the present embodiment, the current value in the predetermined section before the switch 100 is switched from turn on to turn off is compared with the reference value. In this case, the control unit 400 may obtain an average value in the predetermined section before the switch 100 is switched from turn on to turn off, or compare the current value immediately before the switch 100 is switched from turn on to turn off with the reference value to apply the voltage command to the negative power supply unit 310. In addition, the reference value used in the present embodiment may be different from the reference value used in the power converter according to the first embodiment of the present disclosure described above.

In addition to the above-described embodiment, there may also be an embodiment in which the control unit 400 may measure the amount of change in the current flowing in the switch 100 per hour, that is, $d_{Isw/dt}$, in the predetermined section after the switch 100 is turned on, and then calculate a predicted value of the current flowing in the switch 100 when the switch 100 is turned from turn on to turn off through the measured amount of change in current, and compare the predicted value with the reference value to vary the magnitude of the negative power applied from the gate driver 200 to the switch 100. When the predicted value of the current flowing in the switch 100 calculated by the control unit 400 is less than or equal to the reference value, the control unit 400 controls the negative voltage supply unit 310 to apply the first voltage from the gate driver 200 to the switch 100, and when the predicted value of the current exceeds the reference value, the control unit 400 controls the negative voltage supply unit 310 to apply the second voltage from the gate driver 200 to the switch 100.

According to a power converter according to the present disclosure as described above, when a value of current flowing in a switch in a turn-on section of the switch is less than or equal to a reference value, a negative voltage applied to the switch is controlled to a relatively high first voltage to reduce conduction loss, and when the value of the current flowing in the switch exceeds the reference value in the turn-on section of the switch, the negative voltage applied to the switch is controlled to a relatively low second voltage, thereby preventing the malfunction of the switch.

Although preferred embodiments of the present disclosure have been described above, the embodiments disclosed in the present disclosure are only for explaining, not limiting, the technical spirit of the present disclosure. Accordingly, the technical spirit of the present disclosure includes not only each disclosed embodiment, but also a combination of the disclosed embodiments, and further, the scope of the technical spirit of the present disclosure is not limited by these embodiments. In addition, many modifications and alterations of the present disclosure may be made by those skilled in the art to which the present disclosure pertains without departing from the spirit and scope of the accompanying claims. In addition, it is to be considered that all of these modifications and alterations fall within the scope of the present disclosure.

What is claimed is:

1. A power converter, comprising:
    a switch;
    a gate driver configured to drive the switch at a predetermined duty ratio and apply a positive voltage when the switch is turned on and a negative voltage when the switch is turned off;
    a negative power supply unit configured to supply the negative voltage to the gate driver and vary a magnitude of the negative voltage;
    a current sensor configured to sense a current flowing in the switch; and
    a control unit configured to control the negative power supply unit to adjust the magnitude of the negative voltage applied to the switch according to a value sensed by the current sensor,
    wherein when the switch is turned on, the control unit controls the negative power supply unit so that the negative voltage becomes a first voltage if the switch is switched to be turned off when the current sensed by the current sensor is in a reverse direction or is less than or equal to a reference value.

2. The power converter of claim 1, wherein when the switch is turned on, the control unit controls the negative power supply unit so that the negative voltage becomes a second voltage smaller than the first voltage if the switch is switched to be turned off when the current sensed by the current sensor exceeds the reference value.

3. The power converter of claim 1, wherein the switch is a wide band-gap (WBG) power semiconductor device.

4. A power converter, comprising:
    a switch;
    a gate driver configured to drive the switch at a predetermined duty ratio and apply a positive voltage when the switch is turned on and a negative voltage when the switch is turned off;
    a negative power supply unit configured to supply the negative voltage to the gate driver and vary a magnitude of the negative voltage;
    a current sensor configured to sense a current flowing in the switch; and
    a control unit configured to control the negative power supply unit to adjust the magnitude of the negative voltage applied to the switch according to a value sensed by the current sensor,
    wherein the control unit controls the negative power supply unit based on a current value sensed by the current sensor so that when a current value in a predetermined section is less than or equal to a reference value before the switch is switched from turn on to turn off, the negative voltage becomes a first voltage when the switch is switched to be turned off.

5. The power converter of claim 4, wherein the control unit controls the negative power supply unit based on the current value sensed by the current sensor so that when the current value in the predetermined section exceeds the reference value before the switch is switched from turn on to turn off, the negative voltage becomes a second voltage smaller than the first voltage when the switch is switched to be turned off.

6. The power converter of claim 4, wherein the switch is a wide band-gap (WBG) power semiconductor device.

* * * * *